United States Patent [19]
Lee

[11] Patent Number: 5,706,230
[45] Date of Patent: Jan. 6, 1998

[54] INTERNAL VOLTAGE BOOSTING METHOD AND CIRCUIT FOR A SEMICONDUCTOR MEMORY DEVICE

[75] Inventor: Jin-Young Lee, Seoul, Rep. of Korea

[73] Assignee: Samsung Electronics Co., Ltd., Suwon, Rep. of Korea

[21] Appl. No.: 636,600

[22] Filed: Apr. 23, 1996

[30] Foreign Application Priority Data

Apr. 24, 1995 [KR] Rep. of Korea .................. 95-9643

[51] Int. Cl.⁶ ........................................ G11C 7/00
[52] U.S. Cl. ............... 365/189.11; 365/204; 365/191; 365/189.09; 327/538; 327/534; 327/536
[58] Field of Search ................... 365/189.01, 204, 365/191, 189.09, 203; 327/530, 534, 536, 538

[56] References Cited

U.S. PATENT DOCUMENTS

| | | | |
|---|---|---|---|
| 5,451,896 | 9/1995 | Mori | 327/543 |
| 5,592,421 | 1/1997 | Kaneko et al. | 365/189.09 |
| 5,612,861 | 3/1997 | Zhong et al. | 365/59 |
| 5,631,867 | 5/1997 | Akamatsu et al. | 365/189.09 |
| 5,633,825 | 5/1997 | Sakuta et al. | 365/189.09 |

*Primary Examiner*—Viet Q. Nguyen
*Attorney, Agent, or Firm*—Marger, Johnson, McCollom & Stolowitz, P.C.

[57] ABSTRACT

An internal voltage boosting circuit for a semiconductor memory device comprises first and second boosted voltage generators for boosting an internal voltage of said memory device. A voltage level detector is operative to detect the internal voltage. A first logic circuit is operatively connected to the first generator and to the voltage level detector. The logic circuit activates the first generator when (a) the detected voltage falls below a predetermined voltage and (b) the memory device is in an active state. A second logic circuit is operatively connected to the second generator. The second logic circuit activates the second generator when said memory device is in a precharge state.

8 Claims, 5 Drawing Sheets

INTERNAL VOLTAGE BOOSTING METHOD AND CIRCUIT FOR A SEMICONDUCTOR MEMORY DEVICE

BACKGROUND OF THE INVENTION

The present invention relates to an internal voltage boosting circuit for a semiconductor memory device, and more particularly, to an internal voltage boosting circuit for receiving an external power-supply voltage (Vcc) and generating a boosted voltage (Vpp) having a level higher than the external power-supply voltage.

Recently, in accordance with high integration and low voltage consumption requirements of dynamic RAMs, the internal voltage boosting circuit has been widely adopted. The high voltage generated by the internal voltage boosting circuit is mainly used as a voltage source for a word line driver or parallel input/series output units. Typically, a voltage exceeding the sum of the power-supply voltage and threshold voltage is required for driving a word line, which is for reading out cell data "1" to a bit line or for writing the data of the bit line on a cell.

Therefore, in a semiconductor memory device, the boosted high voltage is employed to eliminate a failure in an active mode due to a decrease in the voltage level of the word line driver and parallel input/series output units.

The high voltage used during the active mode is generally obtained by operating the internal voltage boosting circuit in a standby mode. In other words, a voltage level necessary for active mode operations is obtained by detecting a voltage level of the word line driver and parallel input/series output units with a voltage detector. Such detection occurs in the standby mode. When the detected level falls below a predetermined voltage level, the internal voltage boosting circuit is actuated thereby assuring a sufficient voltage level at the beginning of the active mode.

FIG. 1 is a block diagram of a conventional internal voltage boosting circuit which includes a master signal generator 10 for generating a master signal MS responsive to a row address strobe signal/RAS (an external control clock). First and second Vpp generators 12 and 14 are operative in an active cycle. A first controller 16 generates a first control signal CS1 which controls the first and second Vpp generators 12 and 14 responsive to the master signal MS. A second controller 18 generates second control signals CS2 and CS2', also responsive to the master signal MS. A detector 20 detects the level of an internal boosted voltage Vpp in response to the second control signals CS2 and CS2' and generates a third control signal CS3 which enables the first and second Vpp generators 12 and 14 if the Vpp level is less than a predetermined level.

The operation of the conventional internal voltage boosting circuit having such a configuration will now be described with reference to FIG. 2.

The first control signal CS1 is generated in the first controller 16 in response to the master signal MS by inverting the row address strobe signal/RAS. The first and second Vpp generators 12 and 14 are operated in an active cycle by the first control signal CS1 to generate the internal boosted voltage Vpp. Also, the second controller 18 generates the second control signals CS2 and CS2' in response to a rising edge of the master signal MS. Accordingly, the second control signal CS2 enables the detector 20 and the second control signal CS2' causes third control signal CS3 to go to a high level. Thus, even if the first control signal CS1 is transferred to a low state in one active cycle, since the high state of the third control signal CS3 is maintained in a precharge period, the boosted voltage Vpp is continuously generated. Therefore, if the internal boosted voltage becomes less than a predetermined level, a target level can be normally maintained by the continuously generated boosted voltage Vpp during the precharge period. If the level of the boosted voltage detected by the detector 20 in the next cycle is above a predetermined voltage level, the third control signal CS3 goes to a low level. Thereafter, the first and second Vpp generators 12 and 14 operate only in response to the first controller 16.

In the conventional voltage boosting circuit, the first control signal CS1 goes low during the precharge period so that the first and second Vpp generators 12 and 14 operate to boost voltage Vpp only when the level detected by the detector 20 decreases below a predetermined voltage level.

However, in the aforementioned conventional voltage boosting circuit, since the detector 20 operates only once in each active cycle, if the active cycle becomes longer, i.e., the period of the row address strobe signal/RAS becomes longer, a drop in the boosted voltage cannot be compensated for. Therefore, a malfunction may occur in the next cycle due to the level decrease of the boosted voltage Vpp.

SUMMARY OF THE INVENTION

To solve the above-described problems, it is an object of the present invention to provide an internal voltage boosting circuit for a semiconductor device which can compensate for the loss of the boosted voltage by allowing the voltage boosting circuit to operate in response to the detected level of a boosted voltage in an active cycle.

To accomplish the above object, there is provided a method for operating a semiconductor memory device comprising detecting a voltage level during an active period of the memory device, boosting the detected voltage level each time the detected level falls below a predetermined voltage level, and boosting the voltage level during a precharge period of the memory device.

An internal voltage boosting circuit for a semiconductor memory device is also provided in which a first boosted voltage generator is operative to boost an internal voltage of the memory device. A second boosted voltage generator is also operative to boost the internal voltage. A voltage level detector is operative to detect the internal voltage. A first logic circuit is operatively connected to the first generator and to the voltage level detector. The logic circuit activates the first generator when (a) the detected voltage falls below a predetermined voltage and (b) the memory device is in an active state. A second logic circuit is operatively connected to the second generator. The second logic circuit activates the second generator when the memory device is in a precharge state.

Therefore, even if the active period is long, the loss of the boosted voltage Vpp is sufficiently compensated for, which prevents malfunction. Also, the circuit can be built without increasing the layout area therefor.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Figure 1:
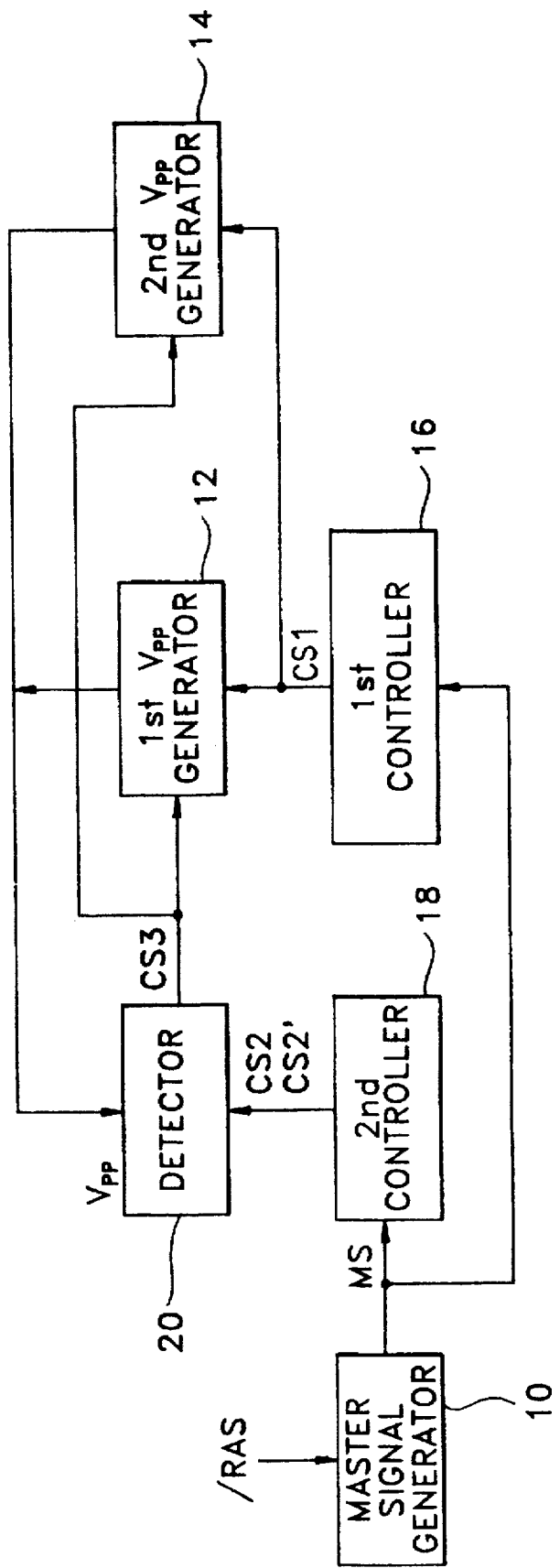
FIG. 1 is a block diagram of a conventional internal voltage boosting circuit.
Figure 2:
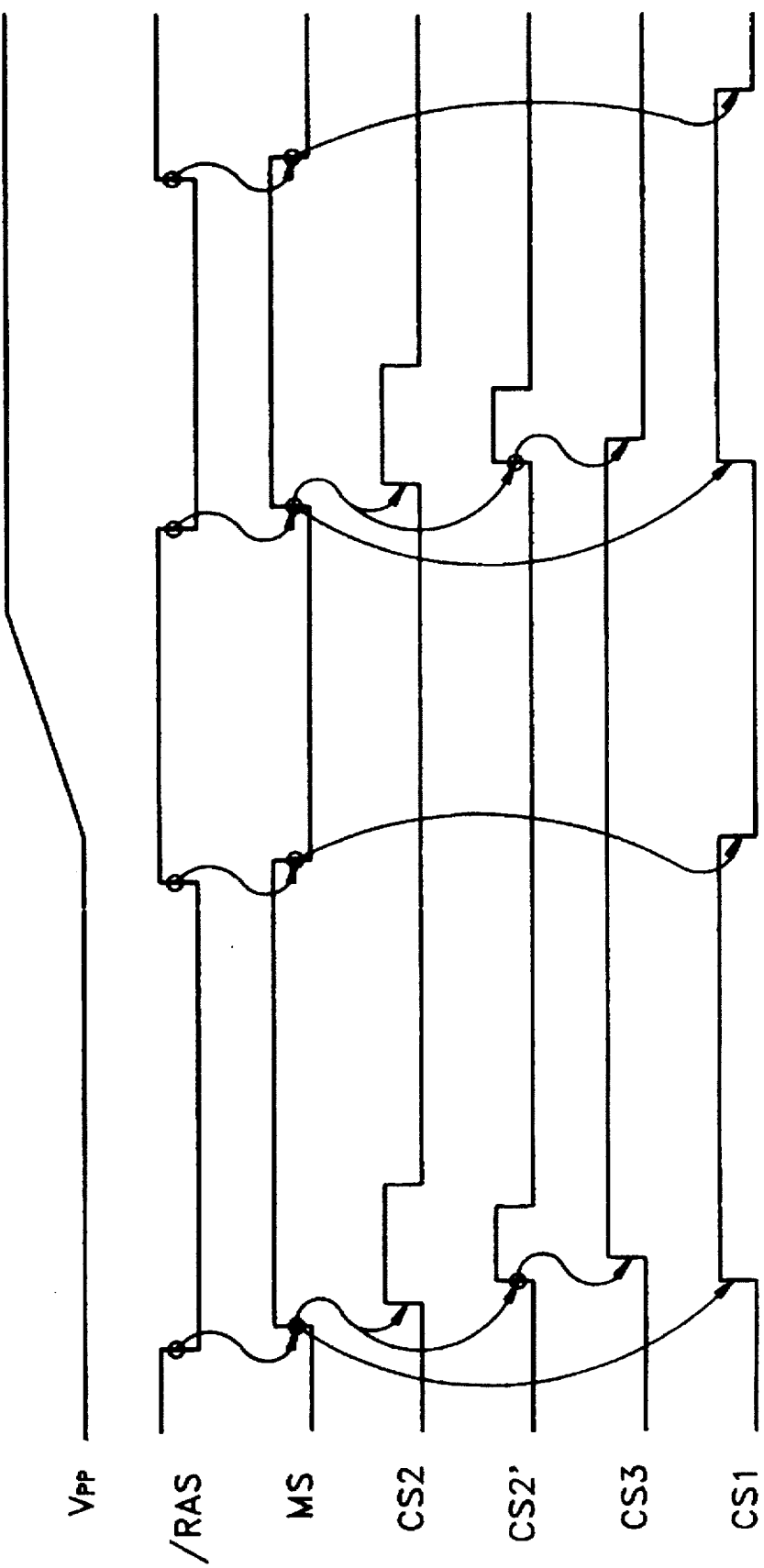
FIG. 2 is a waveform diagram for explaining the operation of the circuit shown in FIG. 1.
Figure 3:
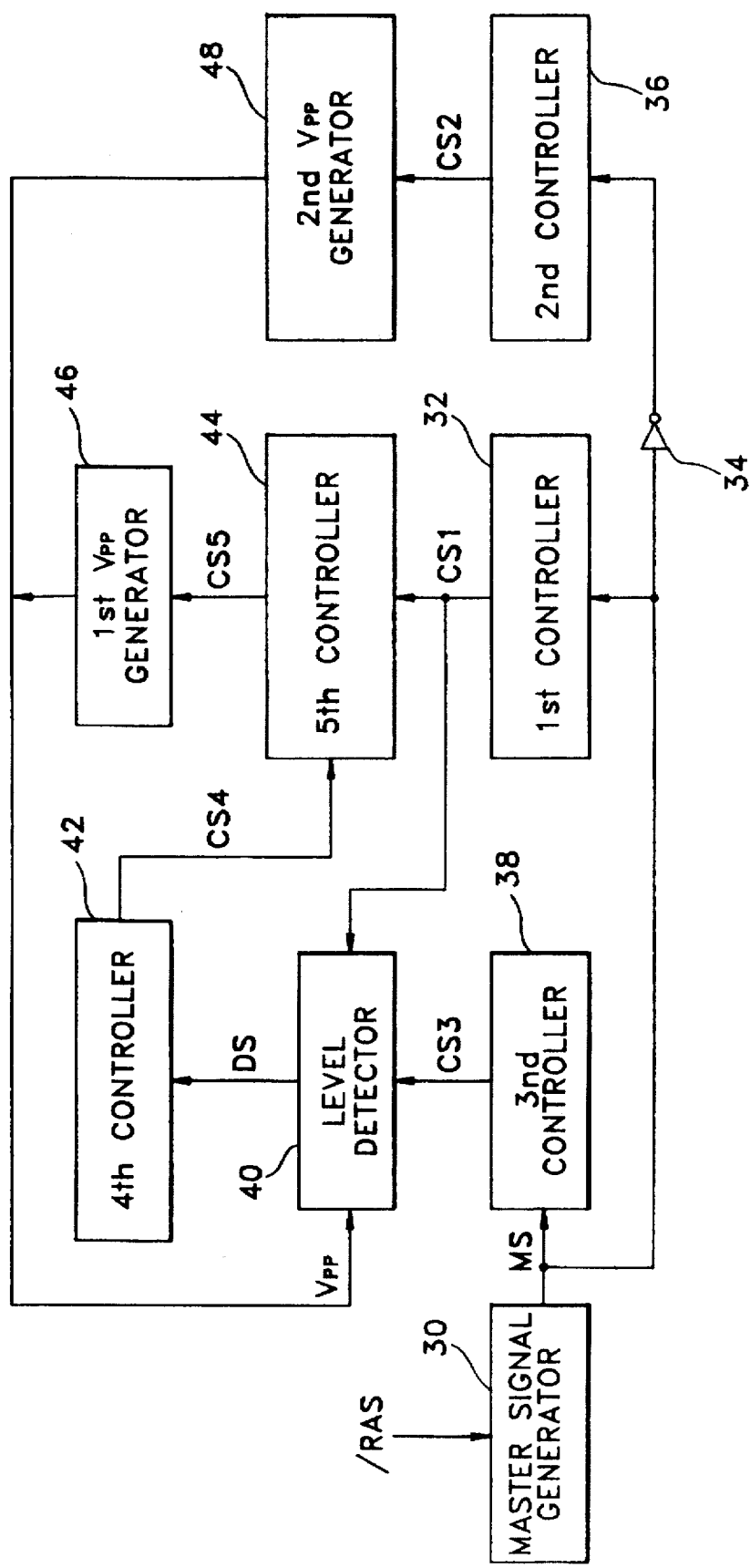
FIG. 3 is a block diagram of an internal voltage boosting circuit according to the present invention.

As shown in FIG. 3, an internal voltage boosting circuit according to the present invention, includes a master signal generator 30 for generating a master signal MS responsive to a row address strobe signal/RAS (art external control clock). A first controller 32 generates a first control signal CS1 also in response to the master signal MS. An inverting gate 34 inverts the master signal MS. A second controller 36 generates a second control signal CS2 in response to the inverted master signal. A third controller 38 generates a third control signal CS3 in response to the master signal MS. A level detector 40 detects the level of the internal boosted voltage Vpp in response to the first and third control signals CS1 and CS3 and generates a detection signal DS if the detected signal level is less than a predetermined level. A fourth controller 42 generates a fourth control signal CS4 in response to the detection signal DS. A fifth controller 44 generates a fifth control signal CS5 in response to the first and fourth control signals CS1 and CS4. A first Vpp generator 46 generates a first boosted voltage in response to the fifth control signal CS5 and a second Vpp generator 48 generates a second boosted voltage in response to the second control signal CS2.

Figure 4:
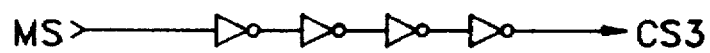
FIG. 4 is a detailed circuit diagram of a first controller shown in FIG. 3.

FIG. 4 is a circuit diagram showing an example of the third controller 38.

Referring to FIG. 4, the third controller 38 is constructed in the form of delays in which four inverters are cascaded to generate the third control signal CS3 for enabling the level detector 40. The third controller enables the level detector by delaying the master signal MS by a predetermined time.

Figure 5:
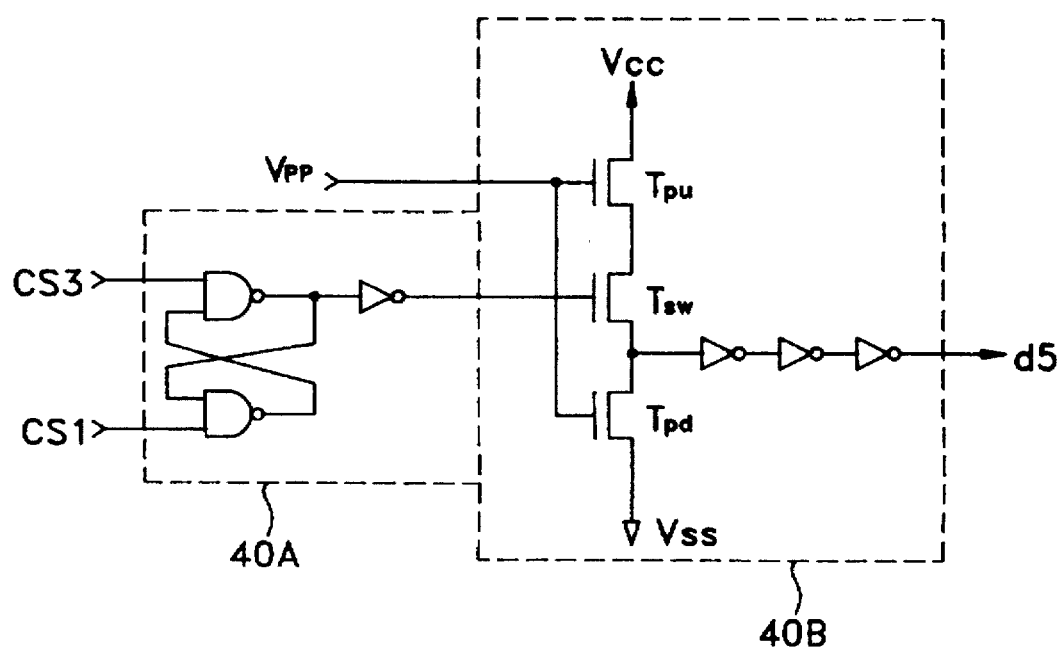
FIG. 5 is a detailed circuit diagram of a level detector shown in FIG. 3.

FIG. 5 is a circuit diagram showing an example of the level detector 40.

Referring to FIG. 5, the level detector 40 includes a latching circuit 40A having a latch constituted by two NAND gates. The first control signal CS1 is a first input and the third control signal CS3 as a second input. An inverter inverts the output of the latch. A detector 40B includes a switching transistor Tsw which is turned on by the output of the latching circuit 40A, a pull-up transistor Tpu which has Vpp applied to its gate and which is connected between a power supply Vcc and the switching transistor Tsw. A pull-down transistor Tpd has Vpp applied to its gate and is connected between a ground Vss and the switching transistor Tsw. Three inverters are cascaded between the connection point of the pull-down transistor Tpd and switching transistor Tsw and an output port.

Figure 6:
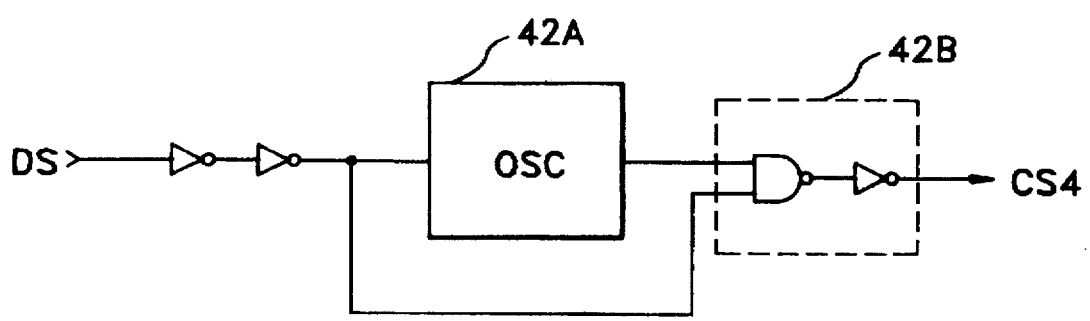
FIG. 6 is a detailed circuit diagram of a fourth controller shown in FIG. 3.

FIG. 6 is a circuit diagram of the fourth controller 42. Referring to FIG. 6, the fourth controller 42 includes an oscillator (OSC) 42A for generating a predetermined oscillating signal in response to the detection signal DS (after DS passes through two inverters, as shown). An output portion 42B has a NAND gate for synthesizing the oscillating signal and the input detection signal and an inverter which produces signal CS4 on the output thereof.

The operation of the internal voltage boosting circuit according to the present invention will now be described with reference to FIG. 7.

Figure 7:
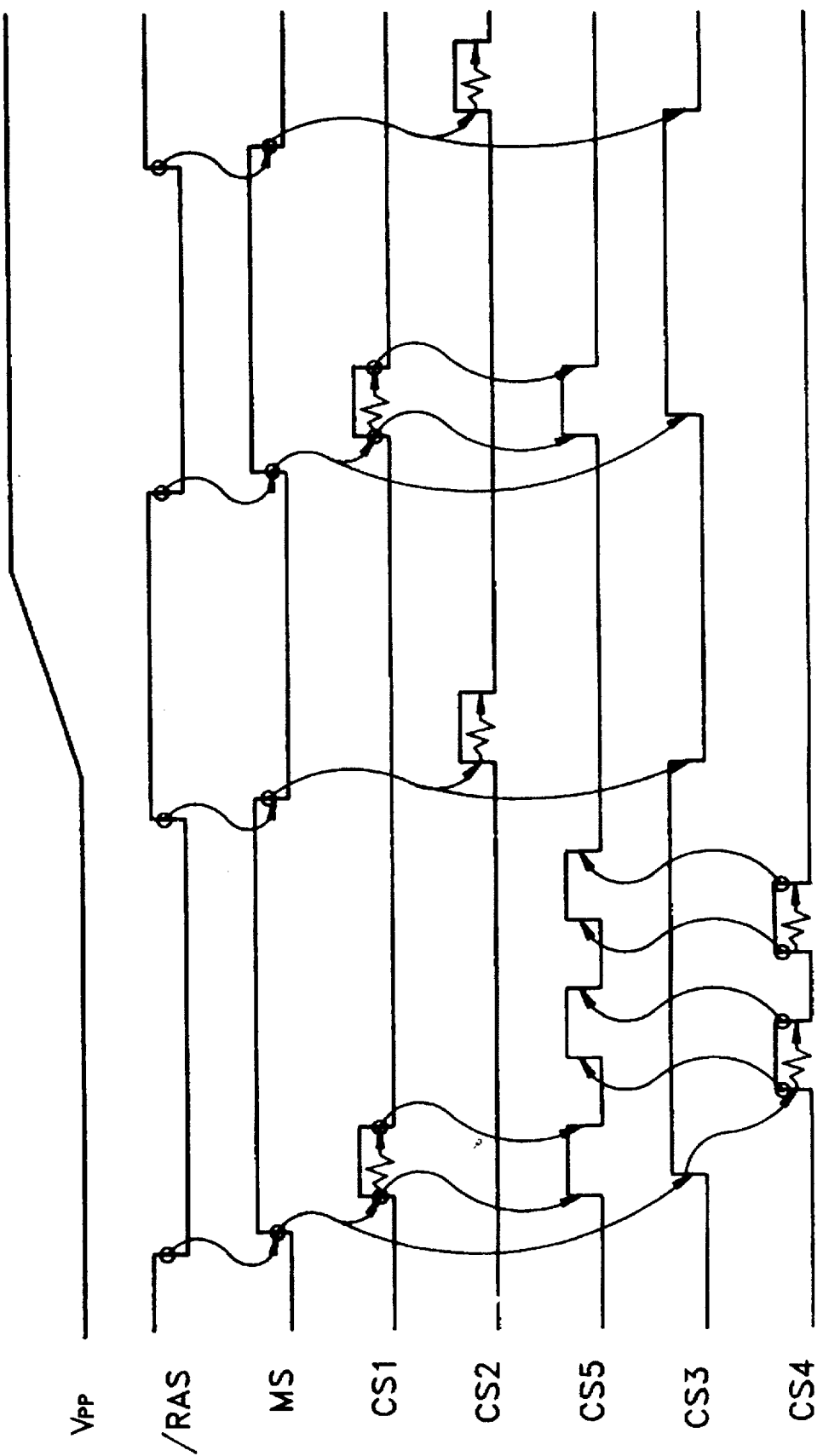
FIG. 7 is a waveform diagram for explaining the operation of the internal voltage boosting circuit according to the present invention.

Referring to FIG. 7, the first control signal CS1 is generated by the first controller 32 in response to a falling edge of the row address strobe signal/RAS. Therefore, the first Vpp generator 46 operates in response to the fifth control signal CS5, which passes through the fifth controller 44, so that the first boosted voltage is supplied as an internal boosted voltage. However, immediately after the activation of the first control signal CS1, the level detector 40 detects that the Vpp is in a low level, i.e., below a predetermined voltage level, and thus generates the detection signal DS. The fourth control signal CS4 is generated in the fourth controller 42 by the detection signal DS. The first Vpp generator 46 therefore operates again responsive to the fifth controller 44.

In other words, during the active period, the first Vpp generator 46 operates intermittently responsive to the fourth controller 42 when a low Vpp level is detected by the level detector 40. The loss of the Vpp can therefore be compensated for during the active period. Also, the second Vpp generator 48 operates during the precharge period, i.e., the high state period of the row address strobe signal/RAS, in response to the second control signal CS2, which is generated by the inverting gate 34 and second controller 36.

Therefore, according to the present invention, the first Vpp generator 46 operates every time the detected Vpp level is less than a desired Vpp level during the active period, and the second Vpp generator 48 operates during the precharge period in every cycle.

As described above, in the present invention, the first and second boosted voltage generators alternately operate during the active period and precharge period. The boosted voltage generators are constructed to be enabled in response to the detected Vpp level, thereby sufficiently compensating for the loss of the Vpp even during a long active cycle. Thus, malfunction can be prevented and the circuit can be built without increasing layout area therefor.

I claim:

1. An internal voltage boosting circuit for a semiconductor device comprising:

a master signal generator, said generator generating a master signal responsive to a row address strobe signal;

a first controller, said first controller generating a first control signal in response to said master signal;

an inverting gate operatively connected to said master signal generator for inverting said master signal;

a second controller operatively connected to said inverting gate, said second controller generating a second control signal in response to said inverted master signal;

a third controller operatively connected to said master signal generator, said third controller generating a third control signal in response to said master signal;

a level detector for detecting the level of an internal boosted voltage in response to said first and third control signals and generating a detection signal if said detected signal level is less than a predetermined level;

a fourth controller operatively connected to said level detector, said fourth controller generating a fourth control signal in response to said detection signal;

a fifth controller, said fifth controller generating a fifth control signal in response to said first and fourth control signals;

a first boosted voltage generator operatively connected to said fifth controller, said first boosted voltage generator generating a first boosted voltage in response to said fifth control signal; and a second boosted voltage generator operatively connected to said second controller, said second boosted voltage generator generating a second boosted voltage in response to said second control signal.

2. An internal voltage boosting circuit for a semiconductor device as claimed in claim 1 wherein said level detector includes a gate for receiving said third control signal immediately after the activation of said first control signal, and a detector for detecting the level of said internal boosted voltage in response to said third control signal having passed through said gate.

3. An internal voltage boosting circuit of a semiconductor device as claimed in claim 1, wherein said fourth controller includes:

an oscillator for generating a predetermined oscillating signal in response to said detection signal; and an output stage for synthesizing said oscillating signal and said detection signal.

4. An internal voltage boosting circuit of a semiconductor device comprising:

first signal generating means for generating a first enabling signal in an initial active period of a row address strobe signal;

second signal generating means for generating a second enabling signal in an initial precharge period of said row address strobe signal;

level detecting means for generating a detection signal activated when the level of an internal boosted voltage is less than a predetermined level, in response to an active period of said first enabling signal and said row address strobe signal;

third signal generating means for generating a third enabling signal in response to said detection signal and first enabling signal;

first boosted voltage generating means for generating a first boosted voltage in response to said third enabling signal; and second boosted voltage generating means for generating a second boosted voltage in response to said second enabling signal.

5. A method for operating a semiconductor memory device of the type having a plurality of address lines which require a boosted voltage during a precharge period and during an active period, said method comprising:

detecting a voltage level during an active period of the memory derive;

boosting the detected voltage level each time the detected level falls below a predetermined voltage level; and boosting the voltage level during a precharge period of the memory device.

6. The method of claim 5 wherein boosting the detected voltage level each time the detected level falls below a predetermined voltage level is performed by a boosted voltage generator.

7. The method of claim 6 wherein boosting the voltage level during a precharge period of the memory device is performed by a second boosted voltage generator.

8. An internal voltage boosting circuit for a semiconductor memory device comprising:

a first boosted voltage generator for boosting an internal voltage of said memory device;

a second boosted voltage generator for boosting said internal voltage;

a voltage level detector operative to detect said internal voltage;

a first logic circuit operatively connected to said first generator and to said voltage level detector, said logic circuit activating said first generator when (a) the detected voltage falls below a predetermined voltage and (b) the memory device is in an active state; and a second logic circuit operatively connected to said second generator, said second logic circuit activating said second generator when said memory device is in a precharge state.

* * * * *